United States Patent
Chang

(10) Patent No.: US 6,343,478 B1
(45) Date of Patent: Feb. 5, 2002

(54) WATER/AIR DUAL COOLING ARRANGEMENT FOR A CPU

(76) Inventor: Neng-Chao Chang, No. 6, Lane 189, Sec. 2, Cung-Yuan Rd., Tu-Cheng City, Taipei Hsien (TW)

( * ) Notice: Subject to any disclaimer, the term of this patent is extended or adjusted under 35 U.S.C. 154(b) by 0 days.

(21) Appl. No.: 09/664,778

(22) Filed: Sep. 19, 2000

(30) Foreign Application Priority Data

Mar. 21, 2000 (TW) .......................................... 89204490

(51) Int. Cl.⁷ .............................................. F25D 23/12
(52) U.S. Cl. ........................... 62/259.2; 62/3.7; 62/3.2
(58) Field of Search ................................ 62/259.2, 3.7, 62/3.2

(56) References Cited

U.S. PATENT DOCUMENTS

| | | | |
|---|---|---|---|
| 4,328,682 A | * 5/1982 | Vana | 62/196 |
| 5,230,223 A | * 7/1993 | Hullar et al. | 62/196.4 |
| 5,269,146 A | * 12/1993 | Kerner | 62/3.6 |
| 5,291,941 A | * 3/1994 | Enomoto et al. | 165/62 |
| 5,471,850 A | * 12/1995 | Cowans | 62/223 |
| 5,823,005 A | * 10/1998 | Alexander et al. | 62/259.2 |
| 6,166,907 A | * 12/2000 | Chien | 361/699 |
| 6,196,003 B1 | * 3/2001 | Macias et al. | 62/3.7 |
| 6,205,803 B1 | * 3/2001 | Scaringe | 62/259.2 |
| 6,213,194 B1 | * 4/2001 | Chrysler et al. | 165/80.3 |

* cited by examiner

Primary Examiner—William Doerrler
Assistant Examiner—Mark S. Shulman
(74) Attorney, Agent, or Firm—Rosenberg, Klein & Lee

(57) ABSTRACT

A water/air dual cooling method CPU cooling arrangement includes a metal water accumulator attached to the CPU to be cooled, a heat exchanger, a pump adapted to pump water through the metal water accumulator and the heat exchanger, keeping cooling water continuously circulated through the metal water accumulator to carry heat away from the CPU, a heat sink attached to the metal water accumulator, and a fan mounted on the heat sink and adapted to cause currents of air toward the heat sink.

3 Claims, 4 Drawing Sheets

WATER/AIR DUAL COOLING ARRANGEMENT FOR A CPU

BACKGROUND OF THE INVENTION

The present invention relates to a CPU cooling arrangement, and more specifically to a water/air dual cooling method CPU cooling arrangement.

During the operation of a computer, heat must be quickly carried away from the CPU, keeping the temperature of the CPU within the designed working range. According to tests or the so-called "10 degree rule", the service life of the CPU will be shortened by half if the temperature of the CPU is increased by 10° C. Various CPU cooling methods and devices have been disclosed. FIG. 1 shows an air-cooling type CPU cooling arrangement according to the prior art. According to this design, a heat sink 12 is closely attached to the CPU 14 and adapted to receive heat from the CPU 14, and a fan 10 is mounted on the heat sink 12 and adapted to cause currents of air toward the heat sink, enabling heat to be quickly dissipated from the heat sink 12 into the air. This arrangement is functional, however it becomes workless if the fan is damaged, or stuck by dust or external objects. FIG. 2 illustrates another design of CPU cooling arrangement according to the prior art. This design uses cooling water to carry heat away from the CPU. According to this design, a metal water accumulator 21 is closely attached to the CPU 14 to be cooled down. The metal water accumulator 21 has a water input end connected to a water input tube 22, and a water output end connected to a water output tube 23. The water input tube 22 and the water output tube 23 are respectively connected to output and input ends of water pumping and heat exchanging unit. This design is functional. However, this design becomes workless if pump means of the water pumping and heat-exchanging unit fails, or the piping is blocked.

SUMMARY OF THE INVENTION

The present invention has been accomplished to provide a water/air dual cooling method CPU cooling arrangement, which eliminates the aforesaid problems. It is one object of the present invention to provide a water/air dual cooling method CPU cooling arrangement, which uses an air-cooling system and a water cooling system to effectively and quickly carry heat away from the CPU. It is another object of the present invention to provide a water/air dual cooling method CPU cooling arrangement, which keeps functioning well in case the water-cooling system fails. It is still another object of the present invention to provide a water/air dual cooling method CPU cooling arrangement, which keeps functioning well in case the air-cooling system fails. It is still another object of the present invention to provide a water/air dual cooling method CPU cooling arrangement, which is compact, and requires less installation space.

DETAILED DESCRIPTION OF THE PREFERRED EMBODIMENT

Figure 1:
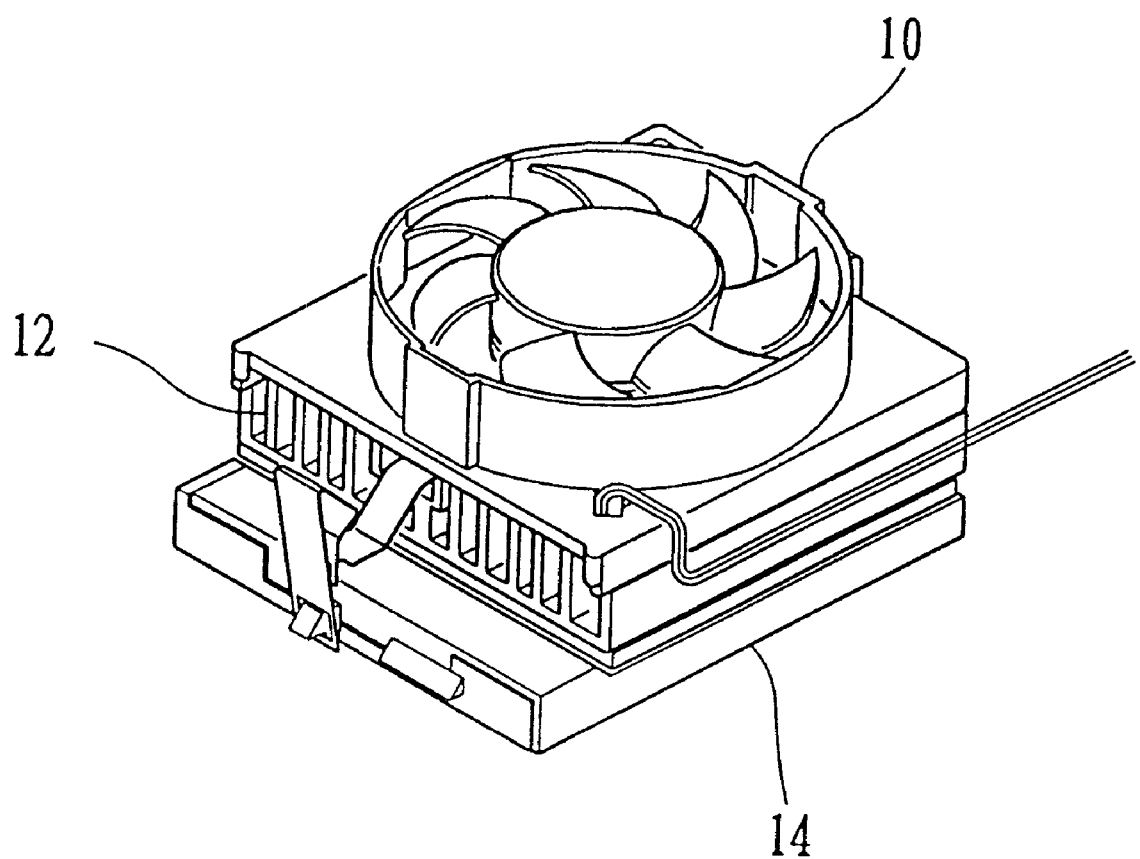
FIG. 1 illustrates an air-cooling type CPU cooling arrangement according to the prior art.
Figure 2:
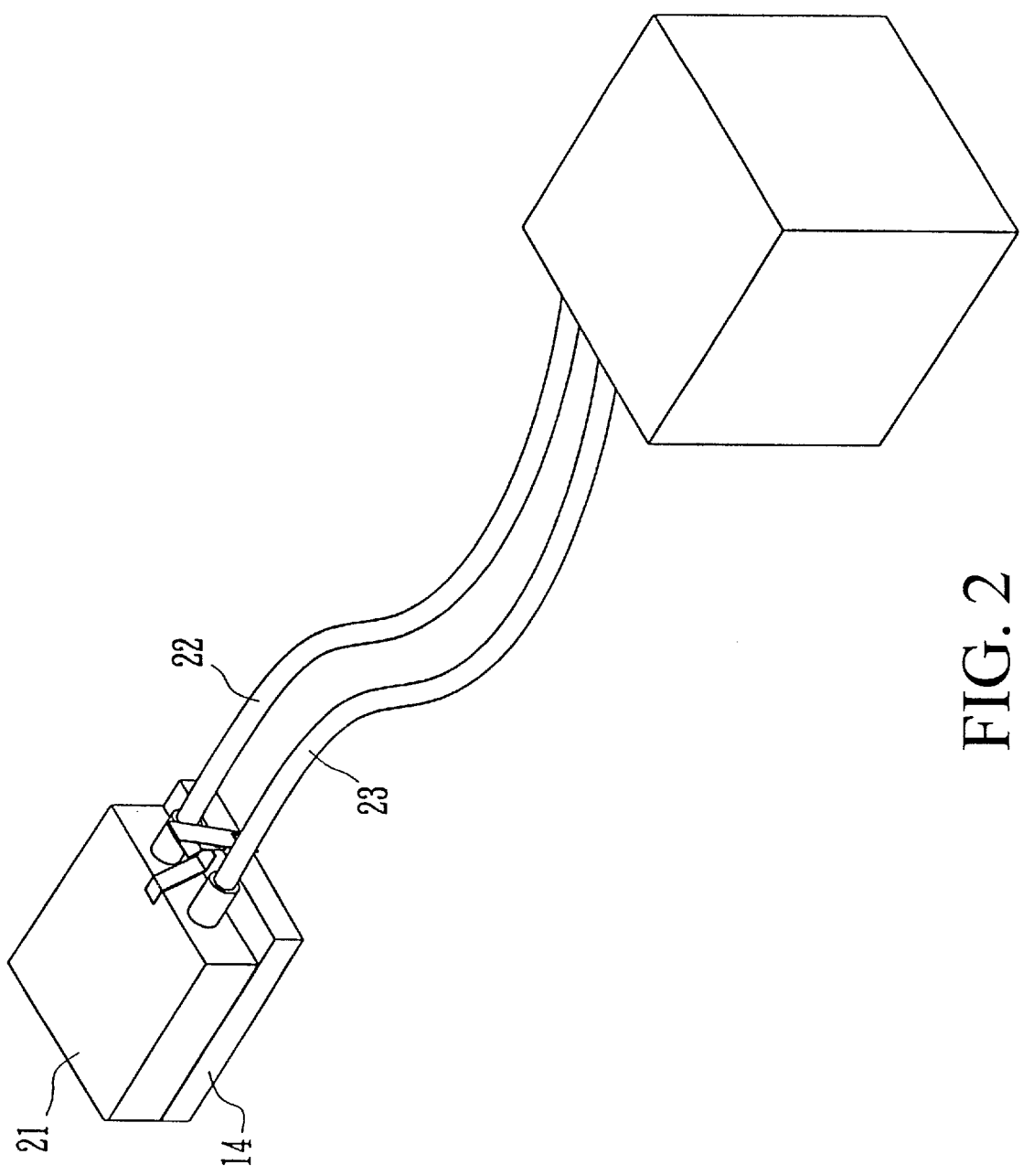
FIG. 2 illustrates a water-cooling type CPU cooling arrangement according to the prior art.
Figure 3A:
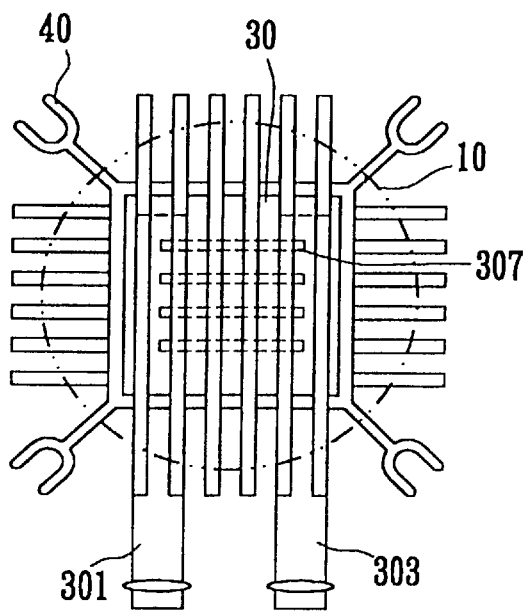
FIG. 3A is a top view in section of a part of a water/air dual cooling method CPU cooling arrangement according to the present invention.
Figure 3B:
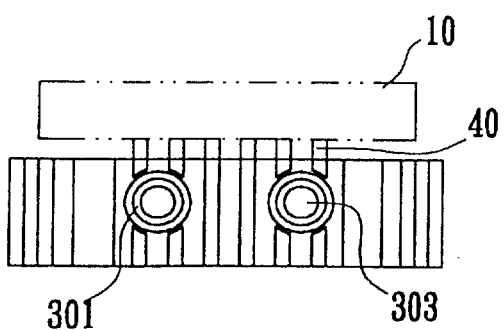
FIG. 3B is a front view of FIG. 3A.
Figure 3C:
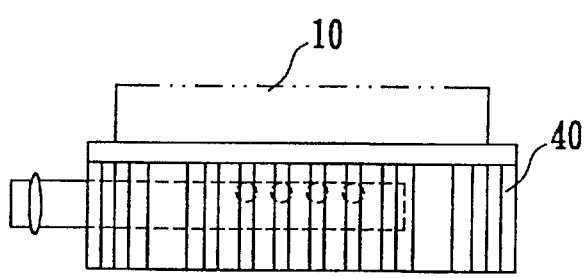
FIG. 3C is a side view of FIG. 3A.
Figure 4:
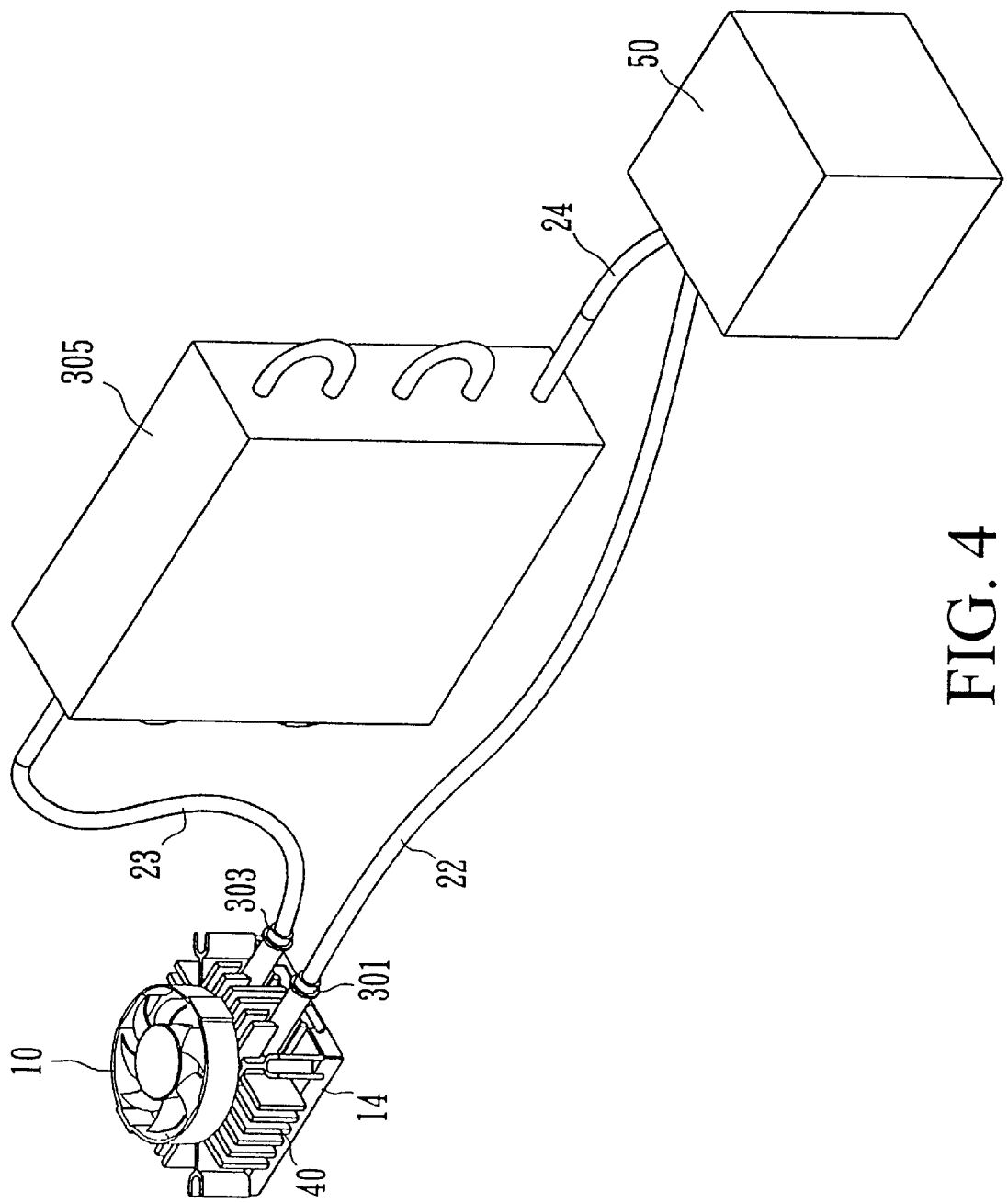
FIG. 4 is an elevational view of the present invention.

Referring to FIGS. 3 and 4, a water/air dual cooling method CPU cooling arrangement in accordance with the present invention is shown comprised of a metal liquid accumulator 30 attached to the surface of the CPU 14, a heat sink 40 mounted on the metal liquid accumulator 30, a fan 10 mounted on the heat sink 40, a pump 50, and a heat exchanger 305. The metal liquid accumulator 30 has a water inlet fixedly mounted with a first water pipe connector 301, which is connected to one end, namely, the output end of the pump 50 through a water tube 22, and a water outlet fixedly mounted with a second water pipe connector 303, which is connected to one end, namely, the input end of the heat exchanger 305 by a water tube 23. The other end, namely, the output end of the heat exchanger 305 is connected to one end, namely, the input end of the pump 50 by a water tube 24. The heat sink 40 is made having a recessed bottom side fitting over the top and peripheral sidewalls of the metal water accumulator 30. When assembled, the heat sink 40 is disposed in close contact with the top and peripheral sidewalls of the metal water accumulator 30 for quick dissipation of heat.

When turning on the CPU 14, the pump 50 is started to pump water, causing it to circulate continuously through the water tube 22, the metal water accumulator 30, the water tube 23, the heat exchanger 305, the water tube 24, and then to the water tube 22 again. When passing through the heat exchanger 305, heat is carried away from water, and therefore cold water is continuously circulated through the metal water accumulator 30 by means of tubes 307, best shown in FIGS. 3A and 3C, enabling heat to be carried away from the CPU 14 through the metal shell of the metal water accumulator 30 and the heat sink 40 and then dissipated into the air. During the operation of the CPU 14, the fan 10 causes currents of cold air toward the heat sink 40 and the metal water accumulator 39, enabling heat to be quickly dissipated into the air.

While only one embodiment of the present invention has been shown and described, it will be understood that various modifications and changes could be made thereunto without departing from the spirit and scope of the invention disclosed.

What the invention claimed is:

1. A water/air dual cooling arrangement for a CPU, comprising:
   (a) a water cooling device adapted to carry heat from a CPU, said water cooling device comprising:
      a metal water accumulator having a top wall and peripheral side walls thereof, said metal water accumulator being attached to the CPU to be cooled, said metal water accumulator having a water input end and a water output end, and
      pump means controlled to pump cooling water through said metal water accumulator, said pump means having a water input end connected to the water output end of said metal water accumulator and a water output end connected to the water input end of said metal water accumulator;

(b) a heat sink positioned in contiguous contact with said metal water accumulator, said heat sink having a recessed portion formed therein to overlay said top and peripheral side walls of said metal water accumulator; and (c) a fan mounted on said heat sink and directing currents of air toward said heat sink and said metal water accumulator.

2. The water/air dual cooling arrangement for a CPU of claim 1, wherein said water cooling device further comprises a heat exchanger adapted to carry heat from water passing through said metal water accumulator, said heat exchanger having a water input end connected to the water output end of said metal water accumulator and a water output end connected to the water input end of said pump means.

3. The water/air dual cooling arrangement for a CPU of claim 1, wherein said metal water accumulator comprises a first water pipe connector fastened to the water input end thereof and connected to the water output end of said pump means, and a second water pipe connector fastened to the water output end thereof and connected to the water input end of said pump means.

* * * * *